(12) United States Patent
Monkman et al.

(10) Patent No.: US 9,054,317 B2
(45) Date of Patent: Jun. 9, 2015

(54) MULTILAYER ORGANIC DEVICE

(75) Inventors: Andrew Monkman, Durham (GB); Hameed Al-Attar, Durham (GB)

(73) Assignee: Thorn Lighting Ltd., Spennymoor, Durham (GB)

( * ) Notice: Subject to any disclaimer, the term of this patent is extended or adjusted under 35 U.S.C. 154(b) by 41 days.

(21) Appl. No.: 13/499,860

(22) PCT Filed: Oct. 5, 2010

(86) PCT No.: PCT/EP2010/064844
§ 371 (c)(1),
(2), (4) Date: Jul. 6, 2012

(87) PCT Pub. No.: WO2011/042443
PCT Pub. Date: Apr. 14, 2011

(65) Prior Publication Data
US 2012/0267618 A1 Oct. 25, 2012

(30) Foreign Application Priority Data

Oct. 5, 2009 (GB) .................................. 0917393.1
Dec. 18, 2009 (EP) .................................... 09252823

(51) Int. Cl.
*H01L 51/30* (2006.01)
*H01L 51/00* (2006.01)
*H01L 51/50* (2006.01)

(52) U.S. Cl.
CPC ........ *H01L 51/0042* (2013.01); *H01L 51/0003* (2013.01); *H01L 51/0035* (2013.01); *H01L 51/0085* (2013.01); *H01L 51/5016* (2013.01)

(58) Field of Classification Search
CPC ............ H01L 51/0037; H01L 51/0005; H01L 51/0007; H01L 51/0039; H01L 51/0042; H01L 51/5004
USPC ...................... 257/40, 98, E51.027, E51.032; 313/504, 506; 428/690, 917
See application file for complete search history.

(56) References Cited

U.S. PATENT DOCUMENTS

| | | | |
|---|---|---|---|
| 6,824,895 B1 * | 11/2004 | Sowinski et al. | 428/690 |
| 7,928,353 B2 * | 4/2011 | Fujimoto et al. | 250/208.1 |
| 2007/0120453 A1 * | 5/2007 | Hwang et al. | 313/112 |
| 2007/0292716 A1 | 12/2007 | Shiobara et al. | |
| 2008/0048559 A1 * | 2/2008 | Lyu et al. | 313/504 |
| 2008/0076872 A1 | 3/2008 | Hahn et al. | |
| 2008/0258111 A1 * | 10/2008 | Ye et al. | 252/301.35 |

(Continued)

OTHER PUBLICATIONS

International Search Report issued in connection with the corresponding International Application No. PCT/EP2010/064844 on Dec. 22, 2010.

*Primary Examiner* — Kenneth Parker
*Assistant Examiner* — Bo Fan
(74) *Attorney, Agent, or Firm* — The H.T. Than Law Group (57) ABSTRACT

In a multilayer organic device (10) comprising a substrate bearing an anode (12) and a cathode (20), wherein located between the anode (12) and the cathode (20) is at least a first layer (16) comprising a first organic semiconductor material; and a second layer (18) over the first layer (16) comprising a second organic semiconductor material; the first organic semiconductor material is a polymer and the second organic material is a polymer or an oligomer, the average molecular weight of the first organic semiconductor material being higher than the average molecular weight of the second organic semiconductor material.

20 Claims, 7 Drawing Sheets

(56) References Cited

U.S. PATENT DOCUMENTS

2009/0121618 A1* 5/2009 Lyon et al. .................... 313/504
2009/0200927 A1* 8/2009 D'Andrade et al. .......... 313/504
2009/0224274 A1* 9/2009 Argitis et al. .................. 257/98
2010/0084672 A1* 4/2010 Ueno et al. .................... 257/98
2010/0133521 A1* 6/2010 Shioya et al. .................. 257/40
2010/0194265 A1* 8/2010 De Cremer et al. .......... 313/503
2010/0231125 A1* 9/2010 Li et al. ........................ 313/504
2011/0121279 A1* 5/2011 Baranoff et al. ............... 257/40

* cited by examiner

| | $a_1$ | $\tau_1$ | $a_2$ | $\tau_2$ | $a_3$ | $\tau_3$ | $<\tau>$ | $\chi^2$ |
|---|---|---|---|---|---|---|---|---|
| G / ITO / PSF | 7.11 | 0.896 | 31.14 | 0.285 | 35.2 | 0.054 | 0.4864 | 1.2 |
| G / ITO / PEDOT / PSF | 10.335 | 1.126 | 27.59 | 0.384 | 18.17 | 0.059 | 0.73958 | 1.1 |
| G / ITO / PEDOT / PVKH / PSF | 11.37 | 1.187 | 26 | 0.408 | 15.400 | 0.06 | 0.81495 | 1.04 |
| G / ITO / PEDOT / PVKH / PSF / Ba / Al | 15.09 | 0.933 | 25.47 | 0.257 | 21.5 | 0.017 | 0.70624 | 1.24 |

PRIOR ART

Figure 15

MULTILAYER ORGANIC DEVICE

BACKGROUND OF THE INVENTION

The present invention relates, in general, to a multilayer organic device and a method of fabricating such a device. More particularly, such a multilayer organic device can be an organic electroluminescent device comprising a polymeric light emitting diode (PLED) or a photoresponsive device such as a solar cell forming a polymeric organic photovoltaic (OPV) device.

Semiconducting polymers make remarkably effective substitutes for conventional inorganic semiconductors in a range of optoelectronic devices. Such devices can include light emitting diodes (LEDs), photovoltaic (PV) diodes, field effect transistors (FETs), and lasers. Conjugated polymers offer considerable material advantages over inorganic semiconductors including chemically tunable optoelectronic properties and low-temperature, solution-based processing suitable for printed electronics.

A single layer organic device comprises a pair of electrodes and an active material generally copolymerized or blended to achieve a desired emission wavelength and to balance injected charge carriers. However, different electron and hole mobility properties of the active material, non-ideal electron and hole injection from the electrodes and quenching by electrodes make single layer organic devices inefficient for many applications.

In contrast to such single layer organic devices, so-called multilayer organic devices comprise at least two layers of an organic material between the electrodes. These multilayer organic devices can be made more efficient than single layer organic devices, because one can engineer the outer layers next to the electrodes to enhance either hole or electron injection, which in turn reduces the turn on voltage in the case of emissive devices or facilitate carrier collections in the case of organic solar cells. One limitation on manufacturing processes involving semiconducting polymers is the difficulties in preparing multilayer organic devices. A challenge of forming such multilayer organic devices is one of building layers of the device without intermixing of layers or damaging existing layers during a layer depositing process.

It is well known in the state of the art to form efficient multilayer organic devices by sublimation of organic molecules in a vacuum and the subsequent deposition into different layers. A drawback of such vacuum deposition technique is that it requires both the use of expensive machinery and in addition leads to a high wastage rate of material. Most importantly, fabricating multilayer organic devices via vacuum deposition is fairly feasible for organic semiconductor material with comparatively larger molecular weight, such as oligomers or polymers since they cannot be thermally evaporated without destruction of the organic material. Thus, organic semiconductor material with comparatively larger molecular weight are preferentially processed in solution, i.e. via wet-chemical deposition techniques including spin coating, ink jet, screen or roll-to-roll printing.

From a cost point of view, solution processing techniques such as wet-chemical deposition are the more attractive technique for mass production, especially for the production of organic devices of larger size. A single layer of semiconducting polymers can be laid down in solution comparatively cheaply in a well controlled way, without the requirement of costly and complex machinery. However, the fabrication of multi-layer structures from solution faces severe challenges. In depositing sequential layers, there is the problem that the solvents might re-dissolve previously deposited layers, resulting potentially in intermixing of layers or damaging of existing layers during a layer depositing process. It might also cause process irreproducibility or reduced efficiency of the resulting devices. In order to avoid these drawbacks, it is therefore important to ensure that layers already deposited from solution are resistant to the solvents used to deposit subsequent layers.

As a matter of fact, only few solution processed multilayer devices have been reported due to the nature of their fabrication. One way to get around the problem of re-dissolution of previously deposited layers is to use materials that can be deposited from orthogonal solvents i.e. solvents that differ distinctly regarding their solubility properties, e.g. by their polarities. An example thereof are polar and non-polar solvents. In general, polar materials can be dissolved in polar solvents while non-polar materials can be dissolved in non-polar solvents. Polar solvents, however, typically do not dissolve non-polar materials and, vice versa, non-polar solvents do not dissolve polar materials.

In principle, a multilayer device could be created by applying layers of polar and non-polar materials in alternating layers. Thereby, polar materials are dissolved in a polar solvent and non-polar materials are dissolved in a non-polar solvent and these two materials are spin coat in consecutive steps upon each other.

The options for the manufacturing of multilayer organic devices regarding orthogonal solvents are quite limited. There is a big disadvantage with this approach. Typically most conjugated, semiconducting polymers are preferentially soluble in organic and/or non-polar media. Thus, in order to create multilayer organic devices with at least two layers of semiconducting polymers, one of the polymers needs to be chemically modified in order to be soluble in a polar solvent such as water. In general, changing the polarity of the semiconducting polymer is not an easy task and will usually be accompanied by a deterioration of the material. Thus, the efficiency and/or the operating lifetime of the device might be negatively affected.

An example where this strategy of using orthogonal solvents is realized for a polymeric light emitting diode is given in Gong et al, 'Multilayer Polymer Light-Emitting Diodes: White-Light Emission with High Efficiency', Adv. Mater. 2005, 17, 2053. There, a three-layer device was fabricated consisting of an emissive layer of a polyfluorene host and an iridium dopant (both soluble in organic solvents; insoluble in water) sandwiched between a water-soluble PVK derivative as a hole-transport layer (HTL) and a water-soluble PBD derivative as an electron-transport layer (ETL).

A different approach creating multilayer organic devices involves rendering deposited layers insoluble through post-deposition treatment. An example thereof for a fully solution-processed light emitting device is disclosed in prior published European patent application EP 1 753 047 A1. Hereby, the general idea is to apply a crosslinkable material for the individual layer and initiate crosslinking after the material is deposited by thermal, chemical or other irradiative means such as ultra-violet curing. By this each deposited layer becomes insoluble to the solvents used for depositing the subsequent layer.

Figure 15:
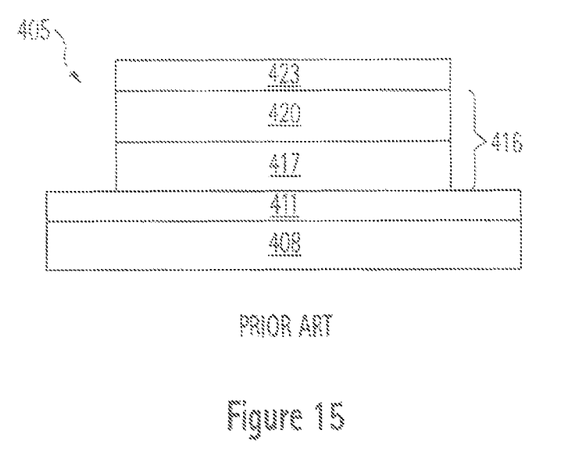
FIG. 15 is a schematic diagram of a multilayer organic device as known from the prior art.

FIG. 15 shows a cross-sectional view of an electroluminescent device according to the above mentioned prior art which is disclosed in prior published European patent application EP 1 753 047 A1. The electroluminescent device may represent one pixel or sub-pixel of a larger display or part of lighting source. The device 405 includes a first electrode 411 on a substrate 408. One or more organic materials are deposited on the first electrode to form one or more organic layers of an organic stack 416. The organic stack 416 includes in particular a hole injection layer (HIL) 417 and an emissive layer (EML) 420. The OLED device 405 also includes a second electrode 423 on the top of the organic stack 416. Other layers than that shown in FIG. 15 may also be added including barrier, charge transport/injection, and interface layers between or among any of the existing layers as desired. According to the teaching of EP 1 753 047 A1, the hole injection layer is fabricated by using a crosslinkable hole injection/transport material doped with conductivity dopants.

As mentioned above, crosslinking is affected by thermal, chemical or other irradiative means such as ultra-violet curing so that each deposited layer becomes insoluble to the solvents used in a layer deposited upon it such as an emissive layer or subsequently deposited electron transport layer. This may include the use of ultraviolet curable inks, crosslinkable side chains, crosslinkable chain end groups or monomers which can be cross-linked into polymers for example.

However, the presence of crosslinkable material or the use of processes such as ultra-violet curing can damage and/or reduce the efficiency of the organic semiconductor layers. In addition, the operating lifetime of the multilayer organic device may be adversely affected.

In summary, in the past years different approaches have been proposed to create multilayer organic devices using solution-based processes. However, the known approaches suffer from a plenty of disadvantages which have been mentioned above. Despite continued research efforts over years, no fully convincing strategy has been found which allows the manufacture of efficient, solution processed multilayer organic devices.

SUMMARY OF THE INVENTION

Accordingly, the present invention seeks to provide a multilayer organic device with minimal intermixing between layers using solution-based processes. It is the aim to provide an alternative method which circumvents or mitigates some of the above mentioned disadvantages.

In the following 'solution processable' shall mean capable of being dissolved, dispersed or transported in and/or deposited from a liquid medium, either in solution or suspension form.

The idea which lays behind the inventive solution to the above problem is based on the finding that the solubility of a polymer does not only depend on the chemical or physical properties of the monomers comprising the polymer, but also depends on the size and structure of the polymer, i.e. how many monomers are on average linked to form the polymer and/or into which conformation/structure. The present invention exploits in particular the dependence of the solubility of a polymer-solvent system on the size of the polymer, i.e. the average molecular weight or the average number of monomers comprising the polymer. In general, the solubility of a polymer-solvent system is reduced as the average number of monomers increases. This means that a solvent which is still strong enough to dissolve a polymer or oligomer comprising only a comparably small number of monomers does not necessarily dissolve a polymer made up from the same monomers as the smaller-sized polymer or oligomer, but comprising a larger number of monomers that are linked together. It is understood that the idea can be applied to homopolymers, i.e. polymers comprising a single monomer species, or copolymers, i.e. polymers build up of two or more different species of monomers (regularly or randomly) as well as to linear or branched polymers and oligomers.

Generally, the inventive solution is based on the concept of fabricating the multilayer organic device by depositing the different layers of the organic semiconductor materials in consecutive solution processing steps. The organic materials and the solvents used are carefully selected to ensure that the efficiency of the organic semiconductor layers are not reduced during the deposition process; i.e., the materials and solvents are selected in such a way that a first organic semiconductor material is non-soluble or only weakly soluble by the solvent of a second organic semiconductor material. According to the present invention, this is achieved by using as a first organic semiconductor material a polymer and as a second organic material a polymer or an oligomer, the average molecular weight of the first organic semiconductor material being higher than the average molecular weight of the second organic semiconductor material.

Thus, in accordance with a first aspect of the present invention, there is provided a multilayer organic device comprising a substrate bearing an anode and a cathode, wherein located between the anode and the cathode is at least a first layer comprising a first organic semiconductor material; and a second layer over the first layer comprising a second organic semiconductor material. The first organic semiconductor material is a polymer and the second organic material is a polymer or an oligomer, the average molecular weight of the first organic semiconductor material being higher than the average molecular weight of the second organic semiconductor material.

Preferably, more than two layers of different organic semiconductor materials are located between the anode and the cathode, the average molecular weight of one of the layers being higher than the average molecular weight of the following layer.

Preferably, the first and the second organic semiconductor polymer have the same HOMO level.

Preferably, the first and second organic semiconductor material comprise the same polymer, the average length of the polymer of the first layer being higher than the average length of the polymer of the second layer.

Preferably, the first organic semiconductor material is provided in a layer on its own.

Preferably, the second organic semiconductor material is doped.

Preferably, the second organic semiconductor material is provided in an electroluminescent layer.

Preferably, the second organic semiconductor material is provided in an electroluminescent layer, the material acting as a host for an emitting species.

Preferably, the electroluminescent layer comprises one or more phosphorescent moieties, the material acting as a host for the one or more phosphorescent moieties.

Preferably, the electroluminescent layer comprises one or more fluorescent moieties, the material acting as a host for the one or more fluorescent moieties.

Preferably, also the first organic semiconductor material acts as a host for a light emissive material.

Preferably, the first organic semiconductor material acts as a host for a yellow emissive material and the second organic semiconductor acts as a host for a blue or blue-green emissive material.

Preferably, the second organic semiconductor material is provided in a blended layer with other polymers, dendrimers or small molecules.

Preferably, the first organic semiconductor polymer is provided in a charge transporting layer.

Preferably, the charge transporting layer is a hole transport layer.

Preferably, the first and the second organic semiconductor material is poly (vinyl carbozole).

Preferably, the average molecular weights of the organic semiconductor materials are a high weight average molecular weight and a low weight average molecular weight.

Further, according to a second aspect of the present invention, there is provided a method of fabricating a multilayer organic device comprising providing a substrate, depositing an anode over the substrate and by a solution processing step depositing over the anode at least a first layer comprising a first organic semiconductor material and a second layer over the first layer comprising a second organic semiconductor material; characterised in that the first organic semiconductor material is a polymer and the second organic material is a polymer or an oligomer, the average molecular weight of the first organic semiconductor material being higher than the average molecular weight of the second organic semiconductor material.

Preferably, the first layer is thermally backed after being deposited.

Preferably, the second layer is thermally backed after being deposited.

Preferably, the solution processing step is spin coating or ink jet printing.

The inventive multilayer organic device can in particular be used in an organic electroluminescent device, e.g., a polymeric light emitting diode (PLED), or a photoresponsive device such as a polymeric organic photovoltaic (OPV) device.

In the following, the present invention is explained in more detail with reference to the accompanying drawings:

DETAILED DESCRIPTION OF THE INVENTION

In the following the invention is explained with a focus on light emitting devices, however the inventive idea can straightforwardly be applied for photoresponsive devices such as photovoltaic diodes, or field effect transistors.

The inventive concept of fabricating a multilayer organic device by depositing several layers of organic semiconductor materials on a substrate without destroying, degrading or negatively influencing the properties of already disposed layers will be explained in the following on the basis of several general embodiments. Afterwards, a specific embodiment of an inventive multilayer organic device is described in more detail with reference to FIGS. 6 to 11.

Figure 1:
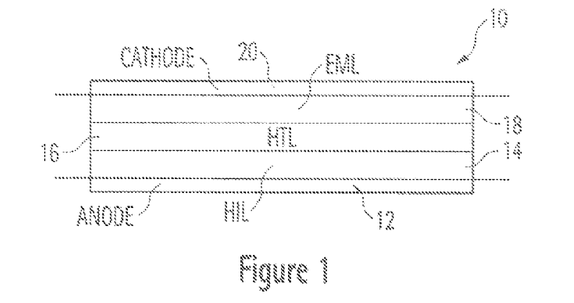
FIG. 1 schematically shows a first embodiment of a multilayer organic device in accordance with the present invention.

The structure of the first embodiment of a multilayer organic device which is shown in FIG. 1 corresponds to the detailed embodiment which will we discussed afterwards with reference to FIGS. 6 to 11. This embodiment forms a so-called organic LED (OLED) 10 and comprises at first an anode 12 which is made for example of indium tin oxide (ITO) and rests on a—not shown—substrate. The substrate should be transmissive for the light generated by the device and therefore is preferably made of glass. Over the anode 12 is deposited in the following order: a hole injection layer (HIL) 14, a hole transport layer (HTL) 16 and an emissive layer (EML) 18. This structure is finished by a cathode 20 made—for example—of Barium Aluminium.

Light is generated by the structure described above as follows and also schematically shown in FIG. 2: A voltage is applied across the OLED 10 such that the anode 12 is positive with respect to the cathode 20. This causes a current of electrons to flow from cathode 20 in the direction to the anode 12. Thus, the cathode 20 injects electrons into the device while the anode 12 withdraws electrons from the device; in other words, the anode 12 injects electron holes to the device wherein this effect is enhanced by the hole injection layer 14.

Under the applied voltage, the injected holes and electrons each migrate toward the oppositely charged electrode. When an electron and hole localize, an exciton which is a localized electron-hole pair having an excited energy state is formed. This generation of excitons preferentially happens in the area of the emissive layer 18. The recombination causes a drop in the energy levels of electrons, accompanied by an emission of radiation whose frequency is in the visible region.

Light is emitted either when the exciton relaxes via a photoemissive mechanism by direct emission of radiation whose frequency is in the visible or infrared region or when the energy is transferred to a fluorescent or phosphorescent material which then relaxes under the emission of light.

In this way, light is generated which leaves the device via the light transmissive anode. Further, the wavelength of the light can be influenced by adding—as shown in FIG. 2—a dye 21 to the emissive layer 18. Finally, the provision of additional layers with a specific function can further improve the efficiency of the OLED. Such further developments of the basic structure shown in FIGS. 1 and 2 will be discussed later.

The device shown in FIG. 1 is called a bottom emissive device since the light generated in the emissive layer is finally emitted via the transmissive substrate. There are, however, also top emissive devices known where the substrate is not transmissive. Here, a transmissive top layer is provided at the upper end of the OLED structure and the light is emitted via this transmissive top layer. It should be noted that the invention discussed in the following in detail is applicable to bottom emissive devices as well as to top emissive devices.

The present invention is in particular directed to the problem of forming the different layers of the OLED structure in such a way that the efficiency of each layer is as high as possible. In particular, the formation of a subsequent layer should not negatively influence or even destroy the structure and/or function of the preceding layer(s).

Preferably, the different layers of the OLED structure are formed by a solution processing method. Preferred examples for such methods are spin coating or ink jet printing which both allow forming thin layers of a material in a fast and efficient way. Both methods—as well as other solution processing methods—bear, however, the risk that the formation of a new layer might somehow degrade or negatively influence the structure of layers which have been applied before. In particular, the solvent for the material which is actually applied to the structure might dissolve also the preceding layer.

The present invention now provides a solution which overcomes the problems mentioned above. This solution is based on the idea of selecting the materials and the solvents used in a way to ensure that the efficiency of the organic semiconductor layers are not reduced during the deposition process of following layers. In particular, the materials and solvents are selected such that the organic semiconductor material of an already existing layer is non-soluble or only weakly soluble by the solvent of the organic semiconductor material of the following layer.

This idea will be further explained in the following with respect to the two active layers, i.e., the hole transport layer 16 and the emissive layer 18 of the OLED structure shown in FIGS. 1 and 2.

As already mentioned, the different layers of the OLED structure are deposited on the surface of a substrate starting with the anode layer 12 and followed by the other layers in respective order. For the hole transport layer 16 and the emissive layer 18, specific combinations of organic material and solvent are selected such that the lower layer, i.e., the hole transport layer 16 is non-soluble or only weakly soluble by the solvent for the organic material used to form the next layer, i.e., the emissive layer 18.

Preferably, a polymer with a relatively high molecular weight, in particular with a weight of at least 1,100,00 is used to form the hole transport layer 16. On the other hand, the emissive layer 18 is then formed by polymer or an oligomer having a lower molecular weight. The reason for this selection is that polymer solubility generally is a function of the molecular weight. In particular, lower weight polymers are usually soluble in relatively weak solvents which are not able to solve polymers with a high molecular weight. In other words, a solvent that dissolves a high molecular weight polymer would dissolve easily a low molecular weight polymer. Accordingly, when the emissive layer 18 is deposited, the solvent for the organic material of the emissive layer 18 will not affect the hole transport layer 16. It is ensured that the efficiency of the hole transport layer 16 is not reduced.

In a preferred embodiment of the present invention, the two consecutive layers 16 and 18 are made from polymers comprising the same monomer species (for example PVK) but with a different average molecular weight, i.e., a different chain length. Since the energy level of a polymer is to a certain extent not very sensitive to its length, there is essentially no difference in the HOMO and LUMO levels of the two polymers with the different average molecular weight. The close matching of the energy level facilitates the hole transport between the layers 16 and 18 without obstruction. In particular, holes can easily transfer from the hole transport layer 16 (comprising the polymer with a high molecular weight) into the emissive layer 18 (comprising the polymer with a low molecular weight). PVK is a preferred material since it is known as a good hole transport material which is important for the efficiency of the hole transport layer 16. For the emissive layer 18, PVK primarily acts as a host for an additional electron transport material 19 (e.g., PBD-2-(4-Biphenylyl)-5-phenyl-1,3,4-oxadiazol) which supports the electron transport in this layer 18. Further, a potential barrier between the LUMO level of PVK and PBD of 0.4 eV or more acts as an electron blocker, increasing the probability of generating light emissive excitons.

Nevertheless, the material used for the two layers can also be different, in particular the second layer could be formed from another polymer or an oligomer. Experiments have shown that it is possible to build OLED devices using PFO and PSBF blue emitting polymers and small molecules oligomers for the emissive layer. For the hole transport layer, a high molecular weight Mn=1,100,000 PVK was used and a relatively weak solvent like toluene was used for the emissive layer. In all these examples, it was possible to build up an efficient OLED structure by solution processing steps were the structure of the consecutive layers was not damaged.

Generally, the basic idea of the present invention, i.e., using organic material of a different weight to ensure that solvents can be used which individually solve a specific layer material but do not solve the organic material of the preceding layer, could be applied to any organic material, in particular to any polymer material. For example, the OLED structure of FIGS. 1 and 2 could be amended such that the active layers 16 and 18 are formed from a polymer material which acts as an electron transport material wherein this polymeric electron transport material additionally acts as a host for a hole transport material. Also in this case, the weight of the polymeric material should be different in both layers in accordance with the present invention.

Figure 3:
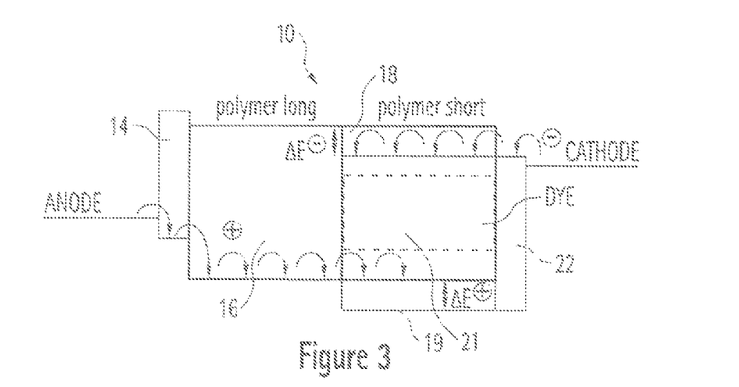
FIG. 3 shows an energy level diagram of the embodiment of FIG. 1 comprising an additional hole blocking layer.

In a further development of the basic embodiment shown in FIG. 1, an additional layer 22 is deposited on the emissive layer 18. This additional layer 22—which is shown in FIG. 3 and consists for example of PBD—represents an electron transport layer with bad hole conduction properties. It has a HOMO level lower than that of the hole transporting material in the emissive layer 18 and thus acts as a hole blocking layer further confining the region where excitons are created. This increases to probability for the creation of excitons and thus the efficiency of the OLED structure.

Additionally, it would also be possible to use the material of the hole transport layer 16 as a host for an emissive dopant. In this way, both active layers 16 and 18 could be used to from emissive layers to emit—for example—light in different colors. This idea is explained in more detail later with respect to Example 2.

So far, the inventive concept has been discussed with reference to an example with two active layers which can form one or two emissive layers. However, the present invention is not restricted to only two layers and it would of course also be possible to prepare devices with more than two active layers.

Figure 2:
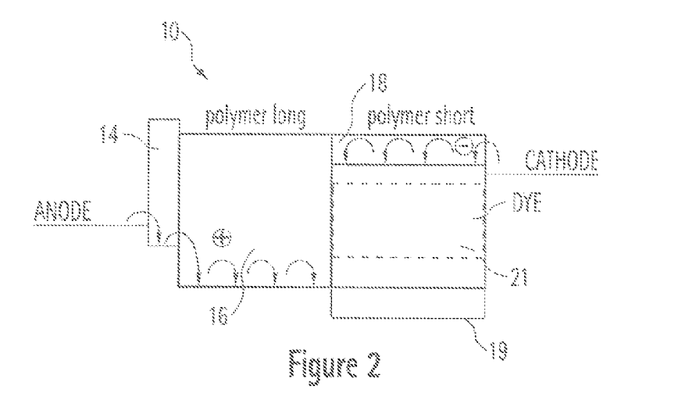
FIG. 2 shows an energy level diagram of the embodiment of FIG. 1.
Figure 4:
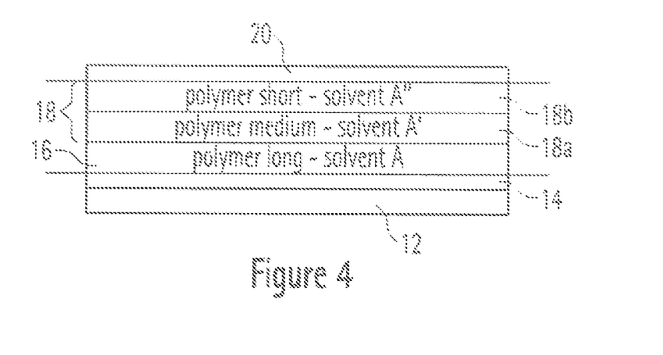
FIG. 4 schematically shows a second embodiment of a multilayer organic device in accordance with the present invention.
Figure 5:
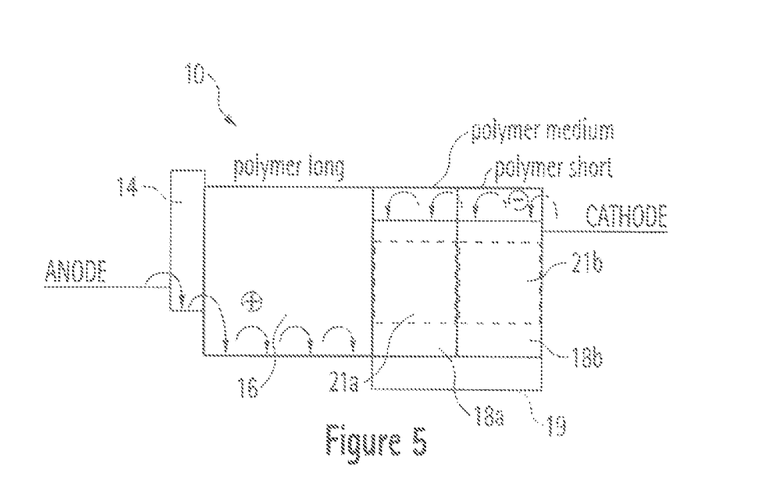
FIG. 5 shows an energy level diagram of the embodiment of FIG. 4.

FIGS. 4 and 5 show an embodiment of an inventive multilayer organic device which corresponds to the first embodiment of FIGS. 1 and 2 but where the emissive layer 18 has been divided in two separate layers 18a and 18b. Each emissive layer 18a, 18b carries its own dye which might be in one case a fluorescent material 21a and in the other case a phosphorescent material 21b. However, it would also be possible to us two different fluorescent materials or two different phosphorescent materials. As explained above, the presence of the fluorescent or phosphorescent material influences the wavelength and thus the color of the light emitting from the emissive layer 18. By adding different wavelength influencing materials to the layers 18a, 18b, light in different colors is obtained and thus the whole OLED structure emits light in a specific mixing color. Similar to the embodiment mentioned above in which the hole transport layer is used as an additional light emissive layer, this technique of multiple emissive layers allows generating light in nearly each desired color, including white light.

In this embodiment, the three active layers 16, 18a and 18b can be formed in consecutive steps wherein the weight of the polymer decreases in each layer and solvents are selected such that they do not affect the polymer of the preceding layer. Accordingly, the following combination of polymers and solvents is used:

| polymer long—solvent A | (HTL, 16) |
| polymer medium—solvent A' | (1$^{st}$ EML, 18a) |
| polymer short—solvent A" | (2$^{nd}$ EML, 18b) |

As an example, the following combinations of average polymer weight/length and solvent could be used wherein the polymer material is PVK:

| HTL: | polymer: 5000 monomers | solvent: chlorobenzene |
| 1$^{st}$ EML: | polymer: 2500 monomers | solvent: toluene |
| 2$^{nd}$ EML: | ploymer: 450 monomers | solvent: methanol and toluene (1:1) |

As mentioned before, it is necessary to start with the high molecular weight material since the concept of the present invention is to employ the solubility of the polymers as a function of molecular weight. Solvent that dissolve the high molecular weight material would dissolve easily the low molecular weight polymer or oligomer. Again the structure of FIGS. 4 and 5 could be further developed by adding a hole blocking layer as shown in FIG. 3 with a solvent mixture of methanol and toluene ratio of (10:1). A weaker organic solvent than toluene can also be used instead of the methanol/toluene mixture regarding that the very low molecular weight polymers or oligomers dissolve in it.

Finally and with reference to FIGS. 6 to 11 and 12 to 14, respectively, two more specific examples of a multilayer organic device will be described in the following. However, it should be emphasized that the specific materials used in the following are only examples and do not in any way restrict the scope of application of the present invention.

EXAMPLES

Example 1

Bilayer Hole Injection Layer Device

Figure 6:
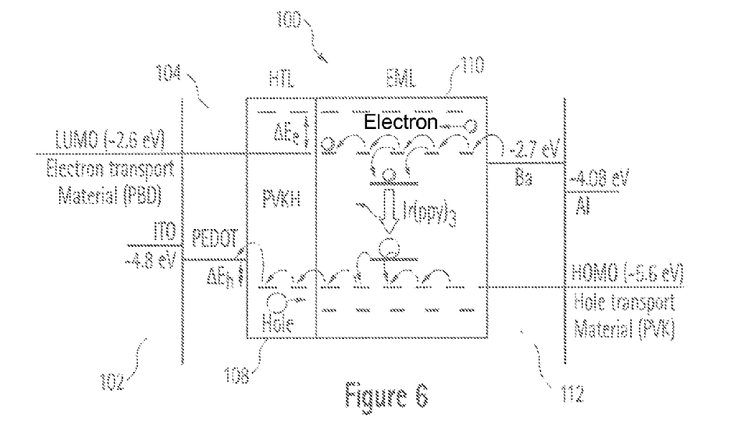
FIG. 6 is a schematic diagram of device architecture and energy levels for materials used in a device according to a first specific example of the present invention.

Referring to the first example shown in FIG. 6, the device 100 comprises at first a glass substrate (not shown in FIG. 6) supporting a patterned anode made of indium tin oxide (ITO) 102. A hole injection layer 104 comprised of a conducting polymer poly(3,4-ethylenedioxy thiophene)/poly(styrenesulfonate) (PEDOT:PSS) 104 is deposited over the indium tin oxide 102. Further, over the PEDOT:PSS is deposited a layer of high average molecular weight poly (vinyl carbozole) (PVKH) 108 acting as a hole transport layer (HTL). Subsequent emission layer (EML) 110 comprises low molecular weight poly (vinyl carbozole) doped with an phosphorescent emitter species Ir(ppy)$_3$. A Barium Aluminium cathode 112 is deposited over the emission layer 110 using evaporation techniques known in the art.

The device fabrication is described in detail the experimental section below. The device architecture and the schematic energy level diagrams for materials used in the device are shown in the scheme of FIG. 6. The well defined multilayer structure was confirmed using ellipsometry, the total film thickness was found to be approximately equal to the sum of the two individual film thicknesses (±3 nm). This indicates that the second semiconductor layer 110 does not dissolve the first layer, i.e. the hole transport layer 108 to any great extent. The insolubility of the high molecular weight PVK (PVKH) film in toluene was measured using ellipsometry which shows that a 110 nm annealed film of the high molecular weight PVKH immersed in toluene for 1 minute reduced by 5 nm only. Also no delaminating was found. Therefore, it can be assumed that the two layers 108 and 110 are well defined and a possibility of only less than 5 nm intermixed layer may be expected.

Figure 7:
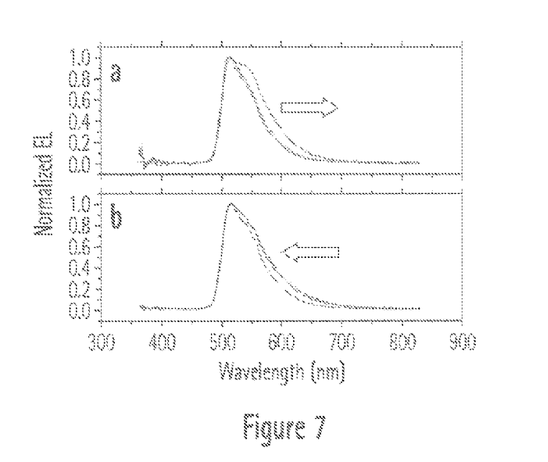
FIG. 7 is a schematic diagram of normalized electroluminescent spectra for multilayer devices (a) a variable hole transport layer with a fixed emission layer thickness, (b) a variable emission layer thickness with a fixed hole transport layer thickness.

The EL emission of the devices at various PVKH layer thickness (x), in a device architecture; glass/ITO/PEDOT:PSS (45 nm)/PVKH (x nm)/PVKL:PBD (40%):Ir(ppy)$_3$ (8%)/Ba (4 nm):Al (150 nm) is shown in FIG. 7. In particular, FIG. 7 shows normalized EL spectra for multilayer devices at (a) variable HTL (PVKH) layer thickness (0, 12, 17.4, 33 nm) with a fixed EML thickness 45 nm and (b) variable EML layer thickness (27, 38.5, 51 nm) with a fixed HTL thickness 19 nm. The arrows indicate the spectral shift directions.

Thicker PVKH layer 108 shows a broadening of the EL spectra on the red side of the emission band (see FIG. 7a). Fixing the HTL (PVKH) layer 108 at 19 nm and changing the EML layer thickness shows the opposite effect as shown in FIG. 7b. Such observations are attributed to the interference effects due to the changes in the optical length where the change in EL spectrum is measured at normal to the surface.

In the present case the EL spectrum has been measured in an integrated sphere where the EL spectrum is averaged over all directions. Similar trends were observed when the device was optically excited (device PL emission), which confirm it is a cavity interference effect. However, the adjustment of the recombination zone of the carriers in the device (dipole location) may also contribute to EL emission profile as the location of the emissive zone inside the device cavity will alter the interference condition. As the HTL thickness increases the recombination zone becomes relatively closer to the cathode than to the anode and a red shift of the long wavelengths side of the EL spectra (band broadening) was observed. On the other hand, if the EML thickness increase at a fixed HTL thickness the recombination zone is located farther away from the cathode and the EL spectra width is reduced as indicated in FIG. 7. The location of the emission zone (dipole location) together with the partial interference effect due to the high reflectivity cathode layer causes this change in the EL spectral profile, and it is an evidence of the change in the location of the emission zone as the HTL or EML layer thickness is changed.

EL broadening in the red side of the spectra was also observed when the dopant concentration was increased which indicates that dopant concentration may also change the emissive zone due to charge trapping in the dopants. In order to understand the effect of the PVKH layer on the electrical characteristics of the organic light emitting device based on molecularly doped polymers, knowledge concerning the mechanisms by which charge carriers are generated, transported, and combined in the EML blended layer is required first. In a single EML layer device, consisting of PVK and PBD only, the injected electrons from the cathode are mainly captured and transported by the PBD, because the LUMO level of the PBD −2.4 to −2.6 eV is the closest to the Ba work-function at −2.7 eV and also because PBD is an efficient electron transport material. At the anode side the nearest HOMO energy level to the PEDOT:PSS −4.9 to −5.2 eV is the HOMO level of the PVK at −5.6 to −5.8 eV. The EL emission measurements of these devices show emission peaks centered at 430 nm (2.88 eV) which is an exciplex emission that forms between electrons at the LUMO level of the PBD with holes at the HOMO level of the PVK and not at 400 nm that is the characteristic emission of the excimer formed between the LUMO-HOMO levels of the PVK molecular units. The recombination process of the PVK: PBD system can be described by the following interaction:

$h(PVK)+e(PBD) \Rightarrow (PVK:PBD)^* \Rightarrow$ exciplex emission at λ=430 nm By doping this system with Ir-complex i.e. Ir(ppy)$_3$, electrons at PBD are strongly trapped to the lowest triplet states T$_1$ of the Ir(ppy)$_3$ −2.8 eV, similarly holes at PVK are trapped at the HOMO level of the Ir(ppy)$_3$ −5.22 eV, generating phosphorescent excitons and only EL emission from Ir(ppy)$_3$ centered at 512 nm (2.42 eV) was observed with no emission from the PVK excimer at 400 nm or from the exciplex at 430 was observed (see FIG. 7). The recombination process of the PVK: PBD: Ir(ppy)$_3$ system can be describe by the following interaction:

$h(PVK)+e(PBD)+Ir(ppy)_3 \Rightarrow PVK+$
$PBD+Ir(ppy)_3^* \Rightarrow$ Exciton emission at λ=512 nm The transport mechanism, therefore, is trap filling space charge limiting current (TF-SCLC). Introducing a HTL to the device which is also made from PVK (but high molecular weight) does not alter the hole injection process from HTL to EML, but it does work as an electron blocking layer since a potential barrier of 0.4-0.6 eV has to be overcome by the electron located in the PBD LUMO level to reach the HOMO level of the PVKH at −2 to −2.2 eV. These mechanisms are illustrated in the scheme of FIG. 6. It should be pointed out that there are two types of electrons and holes involved in the transportation and combination mechanisms in the EML blended layer. Those are free carriers (electrons and holes) that are responsible for the transport, i.e. current-voltage (I-V) characteristics, and trapped carriers responsible of recombination, i.e. EL characteristics. The device efficiency is a combination of the two mechanisms plus the carrier generation by injection.

Figure 8:
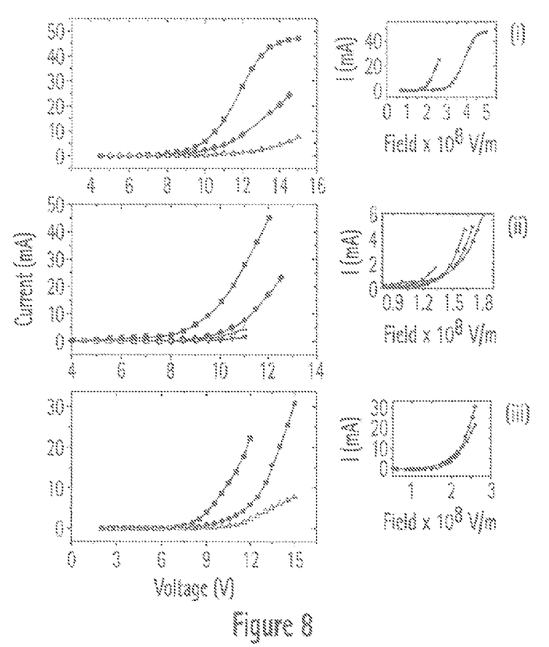
FIG. 8 is a schematic diagram of Current-Voltage (I-V) and Current-Field (I-F) characteristics for three device conditions.
Figure 9:
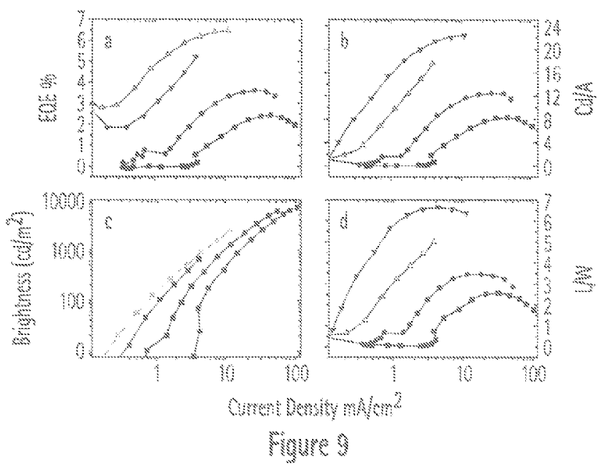
FIG. 9 is a schematic diagram of (a) external quantum efficiency, (b) device current efficiency (cd/A), (c) brightness (cd/m$^2$); and (d) power efficiency (L/W) as a function of current density (mA/cm$^2$) for the device architecture of FIG. 6.

The electrical characteristics of the devices with different HTL thickness are shown in FIGS. 8 and 9. FIG. 8 shows the current-voltage (I-V) and inset the current-field (I-F) characteristics for three devices conditions, (i) variable HTL thickness with low Ir complex dopant concentration (2% w/w) of the EML; (ii) variable HTL thickness with optimum Ir complex dopant concentration (8% w/w) of the EML and (iii) fixed HTL (19 nm) and variable EML (27-51 nm). The first two graphs FIGS. 8(i) and 8(ii) are to study the effect of dopant concentration on the device characteristics at various HTL thicknesses. The third (iii) shows the effect of EML thickness. As the HTL thickness increases, FIG. 8(i) and (ii) the device current decreases and the associated external quantum efficiency (EQE %) and current efficiency (cd/A) is increased (see FIG. 9). This characteristic indicates that the probability of generating excitons is increased. The lower current density measured at thicker PVKH devices indicates that the electron blocking increases the trapping probability at the complex sites yielding more efficient excitons generation. The electron mobility of the emissive layer (PVKL:PBD:Ir (ppy)$_3$) is dominated by the PBD (2×10$^{-5}$ cm$^2$/Vs) and is higher than the hole mobility of the HTL (PVKH) (The measured PVK hole mobility range from 4.8×10$^{-9}$ to 10$^{-6}$ cm$^2$/Vs, depending on the electric field strength). Since both HTL and EML are made from PVK, therefore, this structure benefits from the smooth hole transport across the device layers without hindrance and on the other hand the electrons transport by the PBD and Ir complex are blocked by the PVKH layer due to higher LUMO of the PVK. Therefore, electrons are expected to accumulate at the interface between the PVKH and PVKL:PBD: Ir(ppy)$^3$ giving rise to more exciton generation and a significant enhancement in the device performance can be obtained. PVKH also keeps the emissive zone confined in the EML layer away from the electrodes preventing quenching by the PEDOT. With increasing HTL (PVKH) thickness the electrons accumulate more in the emissive region generating a high local field across the PVKH layer leading to device breakdown. The breakdown voltage depends critically on the HTL layer thickness limiting device thickness to <30 nm.

As the PVKH layer increases the resistance to hole transport increases too (PVK hole resistivity is around 10$^9$ Ωcm, the electron population therefore outnumbers that of holes and the device efficiency tends to decline. Plotting the current as a function of the field strength, FIG. 8 inset, it has been found that the device operating field is lower in the case of the multi layer devices. This indicates the enhancement in the device performance due to exciton confinement. At low Ir-complex concentration FIG. 8(i), the I-F characteristic shows a pronounce difference between the double layer with and that without HTL. The turn-on field is independent of the PVKH thickness. This is due to the saturation of the Ir(ppy)$_3$ trapped excitons and any further blocked electrons in thicker PVKH, they will not contribute to the number of generated excitons. At higher Ir dopant concentration (high trap state density), the increase in the PVKH layer thickness blocks more electrons and causes the exciton population to increase continuously, which shows a gradual shift in the turn-on field to a lower value (FIG. 8(ii) inset). If on the other hand the emissive layer thickness is increased at fixed Ir-complex concentration (at the higher value 8% w/w), the probability of generating exciton increases too due to a higher probability of forming an exciton before carriers reaching the opposite electrode but the turn-on field looks the same at different EML thickness. These characteristics confirm the influence of the PVKH on the turn-on field and hence on the efficiency of the inventive device.

Current efficiencies of 23 cd/A were obtained at a PVKH layer thickness between 18-25 nm and a PVKL:PBD:Ir(ppy)$_3$ emissive layer thickness of 45 nm (see FIG. 9 which shows a) the external quantum efficiency, b) the device current efficiency (cd/A), c) the brightness (cd/m$^2$), and d) the power efficiency (L/W) as a function of current density (mA/cm$^2$) of the solution processed multilayer device structure shown in FIG. 6). The HTL does not increase the turn-on voltage significantly which indicates only the EML thickness controls the turn-on voltage. However, the power efficiency of 6.5 L/W was limited by the high turn on voltage >8V which is related to the large barrier height for hole injection between the PEDOT: PSS and PVK (Δϕ=0.6 eV). The energy barrier between the PBD and PVKH at the interface may also contribute slightly to the turn-on voltage but this barrier is necessary to confine the excitons. The limited brightness of 7000 cd/m² shown in FIG. 9c, for all devices at different HTL thickness reflects the dependence of the brightness on the Ir(ppy)₃ concentration and indicates saturation of the emissive excitons. However, with a thicker EML layer (100 nm), the brightness increases to 13000 cd/m², but the device efficiency drops to 14 cd/A, and EQE to 4%, indicating that the device performance should be described by the brightness× device current efficiency rather than individual parameters. Increasing the device brightness depends not only on the emissive exciton concentration but also on cavity optimization and other quenching processes such as triplet-exciton quenching (triplet-triplet annihilation and triplet-polaron quenching), and field induce quenching.

The effect of the HTL on the exciton quenching by the electrodes was also investigated using time resolve fluorescence photon counting. In order to estimate the quenching strength using time resolved photon counting, poly-spirobifluorene (PSF) was selected as an emissive layer. This fluorescent material was selected because a selective excitation wavelength can be provided by the second harmonic Ti-sapphire laser (372 nm) and also because its fluorescence lifetime is within the photon counting time resolve range (5 ps-3 ns). The fluorescence decay lifetime of thin film PSF without interfacing with electrodes or other polymer layers is around 1 ns. Interfacing PSF with different device layers can of set the effect of various interfaces on the quenching of the emissive layer. Different sample configurations were prepared as shown in below table 1. A device structure with the Ba/Al cathode was also tested without biasing to determine the quenching by the cathode (Ba/Al). The samples were illuminated by the laser beam from the glass side (see FIG. 10 inset). The excitation pulses wavelength was selected at 372 nm. Since PSF has peak absorption at this wavelength while PVKH has no absorption at this wavelength, the laser pulse is selectively exciting the PSF alone.

Figure 10:
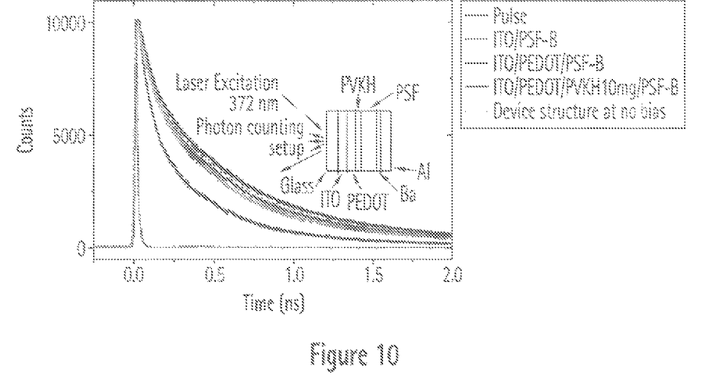
FIG. 10 is a decay time profile of a poly-spirobifluorene (PSBF) layer at various multilayer structures a described in table 1.

FIG. 10 shows the fluorescence intensity decay of the PSF for various sample configurations. As mentioned bevore, the excitation wavelength was 372 nm; the emission wavelength was 420 nm. The Inset of FIG. 10 shows the device structure and the photon counting set-up.

The decay profile was fitted using Globals analysis with three discrete exponential components. This analysis is necessary to isolate the fast decay components that reflect the quenching of the PSF at the interface that is in contact with the other layers, from the slow decay component that reflects the unquenched side of the PSF located away from the contact zone.

Figure 11:
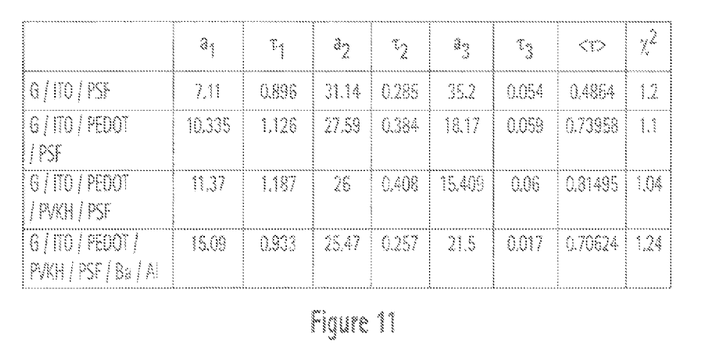
FIG. 11 shows the results of a fluorescence time resolve analysis for different sample configurations.

FIG. 11 shows the three decay components for the different sample configurations. In particular, this figure shows the results of a fluorescence time resolve analysis for the different sample configurations. Three discrete exponential terms were used to fit the decay profile $$I(t) = \sum_{i=1}^{3} a_i \exp(-t/\tau_i)$$

where $a_i$ represents the amplitudes of the components i at t=0, $\tau_i$ is the decay time of the component i. $\chi^2$ is the quality of fit. The average fluorescence lifetime was obtained using $$\langle \tau \rangle = \Sigma a_i \tau_i^2 / \Sigma a_i \tau_i$$

The slowest decay component around 1 ns represents the unquenched PSF which is only slightly affected by the type of contact. The other two components are strongly influenced by the neighboring layers. The fastest components <20 ps are the same for all different interfaces except for device structure with the Ba cathode. This implies that this component is only affected by the cathode. The intermediate component around 250-400 ps clearly displays the effect of the metal electrodes quenching. The HTL slightly reduces the PSF quenching by the PEDOT:PSS. This implies that the effect of the HTL is mainly by confining the exciton rather than preventing quenching by electrodes or the PEDOT:PSS. The quenching by the Ba cathode in the device structure at 0 v bias suggests that further introducing an electron transport layer (ETL) may enhance the device performance by both preventing of quenching by the cathode as well as facilitating electron injection.

In conclusion, a simple and generally applicable method of multilayer all solution processable high efficiency polymer based light-emitting devices has been demonstrated. By using high molecular PVK as a hole transport electron blocking layer, effective electron blocking was achieved which leads to increase exciton population in the phosphorescent zone. The use of low molecular PVK as a host material in the top layer prevent barrier formation for hole transport from the PEDOT to the EML and preserve hole continuity. Furthermore, the HTL prevents the EML from being in contact with the PEDOT. High molecular PVK has high resistivity to many solvent so it is important to properly selecting the top layer solvent in order to reduce layer intermixing. Power efficiency is poor due to poor hole injection which can be increased to match the high device current efficiency of >23 cd/A.

Experimental Details:

It is well known that PVK is a good hole transport polymer. In addition PVK has also been used extensively as a host material for a number of phosphorescent dopants due to its high triplet energy level 2.6-2.7 eV.

All devices were fabricated on indium tin oxide (ITO)-coated glass substrates of thickness 125 nm and possessing a sheet resistance of 20 Ω/□. Poly(3,4-ethylenedioxythiophene) in poly(styrenesulfonic acid) (PEDOT:PSS), obtained commercially from Bayer A.G. Germany, was spin-coated in two stages; 500 rpm for 10 sec followed by 2500 rpm for 60 sec to produce a ~40 nm thick hole-transporting layer (HTL). These HTL coated substrates were then annealed at 200° C. for 3 min on a hot plate to remove any residual water. A chlorobenzene solution of various concentration (mg/ml) of a high molecular weight poly (vinyl carbazole) PVKH (Mw=1,100,000) was spin coated at 2500 rpm to give 12-52 nm as a hole-transport material. This second layer was annealed at 120° C. for 10 min to remove the solvent and left to cool down to room temperature. A toluene solution of low molecular weight of PVKL (Mw=43000) with 40% ww of 2-(4-biphenylyl)-5-(4-tetr-butyl-phenyl)-1, 3, 4-oxadiazole (PBD) as an electron transport material for balancing charge carrier transport and doped with 8% w/w of the Ir complexes was prepared. The solution was filtered with 2.5 mm pore filter and spin coated at 2500 rpm on the top of the hole transport layer PVKH and baked for 10 min at 120° C. which is act as a light-emitting layer (EML). Each sample had a shadow mask applied to produce two identical devices of area 4×12 mm; the samples were then introduced into a nitrogen glove box, where 4 nm barium cathodes were evaporated onto the device at a rate of ~1 Å/s under vacuum at a pressure of ca. 1×10⁻⁶ mm Hg. This was followed by the deposition of a 150 nm capping layer of aluminum under the same evaporation conditions. Similar procedures were used to fabricate single layer PVKH (chlorobenzene) and PVKL (toluene) and a double layers PVKH (chlorobenzene)/PVKL(toluene) on SiSiO$_2$ substrates for film thickness measurement using a J. A. Woollam ellipsometer.

Current-voltage (I-V) characteristics and the emission intensities were measured in a calibrated integrating sphere with data acquisition controlled using a home-written NI LabView program which controlled Agilent Technologies 6632B power supply. The electroluminescence (EL) spectra were measured using an Ocean Optics USB 4000 CCD spectrometer supplied with 400 mm UV/Vis fiber optic.

The effect of the HTL on the EML fluorescence efficiency was measured using time resolved fluorescence photon counting. The excitation wavelength at 372 nm was generated from the second harmonic frequency of Ti-Sapphire laser operating at 76 MHz. Poly(spiribifluorene) (PSF) dissolved in toluene was also used as an EML layer which can be spin coated on the PVKH layer. A set of different multilayers configurations were prepared on glass or glass/ITO substrates as indicated in FIG. 11.

Example 2

Bi-Layers White Light Emitting Device

Figure 12:
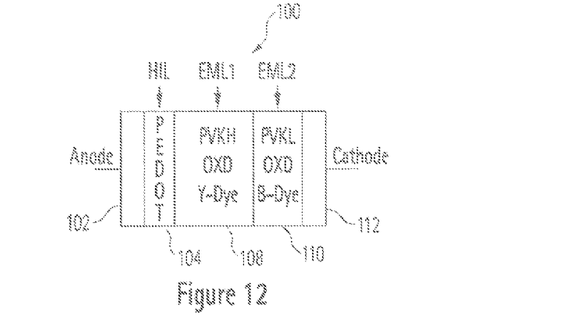
FIG. 12 is a schematic diagram of device architecture according to a second specific example of the present invention.
Figure 13:
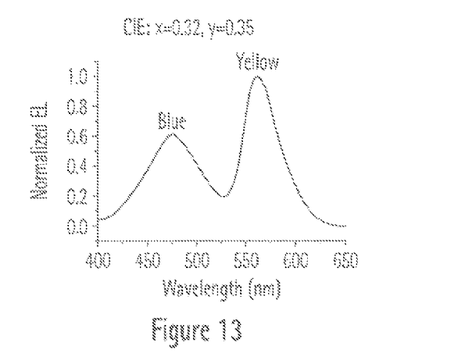
FIG. 13 is a schematic diagram of a normalized electroluminescent spectrum for the device of FIG. 12.
Figure 14:
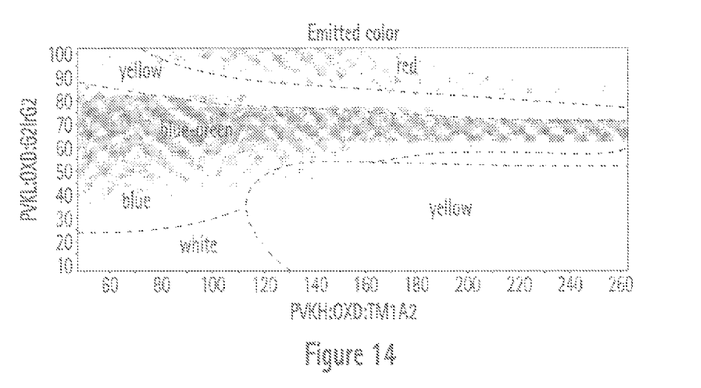
FIG. 14 is a schematic diagram showing the emitted color for different combinations of the two layer thicknesses of the device of FIG. 12.

The structure of the second specific example of a multilayer organic device is shown in FIGS. 12 to 14. This embodiment forms a so called multicolours organic LED to generate white light for back-lighting or general lighting applications.

The white light generated in this embodiment comprises only two nonsaturated colours (blue-green and yellow emitters) instead of three saturated colours (blue, green and red). The device structure comprises a similar layer structure order to that described in Example 1. The hole transport layer (HTL) in the first example has now been used to form a yellow emissive layer (EML1) which comprises a mixture of host material (PVKH), electron transport material and yellow emissive dopant spin coated from chlorobenzen solution. The host material (PVKH) is preferably mixed with low concentration electron transport material <20% w/w, to avoid losing PVKH resistance to the second layer solvent. The second layer (EML2) forms a blue-green emissive layer and comprises a mixture of host material (PVKL), electron transport material and blue emissive dopant such as one of the Firpic family spin coated from toluene solution.

Accordingly, the device structure in this second example is as follows: Glass/ITO (120 nm)/PEDOT:PSS (65 nm)/PVKH:OXD-7 (<20% w/w): Yellow emissive complex/PVKL:OXD-7 (30% w/w):Blue emissive complex. Ba(4 nm)/Al (100 nm). The resulting EL emission of this device is shown in FIG. 13.

The thickness of the two layers (EML1 and EML2) can now be selected in a way to optimise the optical output coupling. For a desired white light emission, the PVKH layer thickness should be between 50-160 nm and PVKL layer thickness should be between 10-50 nm. Different combinations of PVKH and PVKL thicknesses have been tested using SETFOS 3.1 to obtain the highest device efficiency at CIE coordinates close to (0.33, 0.33). The results are shown in FIG. 14. As can be gathered from this figure, the white color CIE: x=0.32, y=0.35 was obtained with PVKH layer thickness of 120 nm and a PVKL layer thickness of 30 nm.

The invention claimed is:

1. A multilayer organic device comprising a substrate bearing an anode and a cathode, wherein located between the anode and the cathode is at least a first layer comprising a first organic semiconductor material; and a second layer over the first layer comprising a second organic semiconductor material wherein the first and the second layers are distinct and characterized in that the first organic semiconductor material is a polymer having a number average molecular weight of at least 1,100,000 and the second organic material is a polymer or an oligomer, the average molecular weight of the first organic semiconductor material being higher than the average molecular weight of the second organic semiconductor material, wherein the first and the second organic semiconductor material have the same HOMO level and the first and second organic semiconductor material comprise the same monomer species, wherein an average length of the polymer of the first layer is at least 5,000 monomers and is larger than an average length of the polymer of the second layer, wherein the first and second organic semiconductor material is poly (vinyl carbazole).

2. A multilayer organic device as claimed in claim 1, wherein more than two layers of different organic semiconductor materials are located between the anode and the cathode, the average molecular weight of one of the layers being higher than the average molecular weight of the following layer.

3. A multilayer organic device as claimed in claim 1, wherein the first and second organic semiconductor material comprise the same polymer, the average length of the polymer of the first layer being higher than the average length of the polymer of the second layer.

4. A multilayer organic device as claimed in claim 1, wherein the first organic semiconductor material is provided in a layer on its own.

5. A multilayer organic device as claimed in claim 1, wherein the second organic semiconductor material is doped.

6. A multilayer organic device as claimed in claim 1, wherein the second organic semiconductor material is provided in an electroluminescent layer.

7. A multilayer organic device as claimed in claim 6, wherein the second organic semiconductor material is provided in an electroluminescent layer, the material acting as a host for an emitting species.

8. A multilayer organic device as claimed in claim 6, wherein the electroluminescent layer comprises one or more phosphorescent moieties, the second organic semiconductor material acting as a host for the one or more phosphorescent moieties.

9. A multilayer organic device as claimed in claim 6, wherein also the first organic semiconductor material acts as a host for a light emissive material.

10. A multilayer organic device as claimed in claim 9, wherein the first organic semiconductor material acts as a host for a yellow emissive material and the second organic semiconductor acts as a host for a blue or blue-green emissive material.

11. A multilayer organic device as claimed in claim 1, wherein the second organic semiconductor material is provided in a blended layer with other polymers, dendrimers or small molecules.

12. A multilayer organic device as claimed in claim 1, wherein the first organic semiconductor polymer is provided in a charge transporting layer.

13. A multilayer organic device as claimed in claim 12, wherein the charge transporting layer is a hole transport layer.

14. A multilayer organic device as claimed in claim 1, wherein the average molecular weights of the organic semiconductor materials are a high weight average molecular weight and a low weight average molecular weight.

15. A method of fabricating a multilayer organic device comprising providing a substrate, depositing an anode over the substrate and by a solution processing step depositing over the anode at least a first layer comprising a first organic semiconductor material and a second layer over the first layer comprising a second organic semiconductor material wherein the first and the second layers are distinct; characterized in that the first organic semiconductor material is a polymer having a number average molecular weight of at least 1,100,000 and the second organic material is a polymer or an oligomer, the average molecular weight of the first organic semiconductor material being higher than the average molecular weight of the second organic semiconductor material, wherein the first and the second organic semiconductor material have the same HOMO level and the first and second organic semiconductor material comprise the same monomer species, wherein an average length of the polymer of the first layer is at least 5,000 monomers and is larger than an average length of the polymer or oligomer of the second layer, wherein the first and second organic semiconductor material is poly (vinyl carbazole).

16. A method as claimed in claim 15, wherein the first layer is thermally backed after being deposited.

17. A method as claimed in claim 16, wherein the second layer is thermally backed after being deposited.

18. A method as claimed in claim 15, wherein the solution processing step is spin coating or ink jet printing.

19. The multilayer organic device as claimed in claim 1, wherein the first and the second layers are separated by an intermixed layer formed from the first and second organic semiconductor materials.

20. The multilayer organic device as claimed in claim 19, wherein the intermixed layer has a thickness of less than 5 nm.

* * * * *